United States Patent [19]

Kim

[11] Patent Number: 5,290,726
[45] Date of Patent: Mar. 1, 1994

[54] DRAM CELLS HAVING STACKED CAPACITORS OF FIN STRUCTURES AND METHOD OF MAKING THEREOF

[75] Inventor: Hong S. Kim, Daejun-si, Rep. of Korea

[73] Assignee: GoldStar Electron Co., Ltd., Seoul, Rep. of Korea

[21] Appl. No.: 836,690

[22] Filed: Feb. 18, 1992

[30] Foreign Application Priority Data

Feb. 18, 1991 [KR] Rep. of Korea ............. 2580/1991

[51] Int. Cl.[5] ........................................... H01L 21/70
[52] U.S. Cl. ......................................... 437/52; 437/47; 437/48; 437/60; 437/919
[58] Field of Search .................. 437/47, 48, 52, 60, 437/228, 235, 981; 148/DIG. 161; 357/23.6; 156/644

[56] References Cited

U.S. PATENT DOCUMENTS

| | | | |
|---|---|---|---|
| 4,614,564 | 9/1986 | Sheldon et al. | 156/644 |
| 4,641,166 | 2/1987 | Takemae et al. | 357/23.6 |
| 4,649,406 | 3/1987 | Takemae et al. | 357/23.6 |
| 4,754,313 | 6/1988 | Takemae et al. | 357/41 |
| 4,902,377 | 2/1990 | Berglund et al. | 156/644 |
| 4,953,126 | 8/1990 | Ema | 365/182 |
| 4,970,564 | 11/1990 | Kimura et al. | 357/23.6 |
| 4,974,040 | 11/1990 | Taguchi et al. | 357/23.6 |
| 5,014,103 | 5/1991 | Ema | 357/41 |
| 5,021,357 | 6/1991 | Taguchi et al. | 437/52 |

FOREIGN PATENT DOCUMENTS

| | | | |
|---|---|---|---|
| 0079327 | 4/1988 | Japan | 437/228 |
| 0293967 | 11/1988 | Japan | 437/919 |
| 0142161 | 5/1990 | Japan | 437/235 |

OTHER PUBLICATIONS

A New Stacked Capacitor DRAM Cell Characterized by a Storage Capacitor on a Bit-Line Structure by Kimura, Kawamoto, Kure, Hasegawa, Etoh, Aoki, Takeda, Sunami and Itoh-Central Research Laboratory, Hitachi Ltd. (IEDM 1988, pp. 596–599).

3-Dimensional Stacked Capacitor Cell for 16M and 64M DRAMs by Ema, Kawanago, Nishi, Yoshida, Nishibe, Yabu, Kodama Nakano and Taguchi-Fujitsu Laboratories Limited (IEDM 1988, pp. 592–595).

*Primary Examiner*—Tom Thomas
*Attorney, Agent, or Firm*—Alan R. Loudermilk

[57] ABSTRACT

A method of making dynamic random access memory cells having stacked capacitors of fin structures enabling the extension of the capacitor regions, irrespective of the used design rule. The method uses insulation layers having different etch selectivities, in order to extend the area of capacitor regions. The method comprises the steps of depositing three insulation layers on a semiconductor substrate, etching the uppermost insulation layer partially and then wet etching the intermediate insulation layer to remove its exposed portions completely and its hidden portions disposed beneath the third insulation layer partially to a predetermined length for extending the area of capacitors regions. The wet etch time of the insulation layers are controlled to control the etched length. With this extension of the area of capacitor regions, the buried contacts are formed by wet etching and are stable. Also, the number of mask processes is reduced, thereby enabling the manufacturing process to be simplified.

14 Claims, 5 Drawing Sheets

DRAM CELLS HAVING STACKED CAPACITORS OF FIN STRUCTURES AND METHOD OF MAKING THEREOF

BACKGROUND OF THE INVENTION

1. Field of the Invention

The present invention relates to semiconductor memory elements and more particularly to dynamic random access memory cells having stacked capacitors of fin structures and a method of making thereof.

2. Description of the Prior Art

Presently, semiconductor memory elements have a tendency to be highly integrated on a semiconductor chip. This high integration is achieved by increasing the density of the semiconductor memory elements on the chip. However, this increase in density results in a decrease in the area of the cell regions of the semiconductor memory elements. For obtaining a sufficient capacitance in a small cell region, there have been various developments such as dielectric materials having high dielectric constants and superior characteristics, methods of increasing the capacitor region, and methods for reducing the thickness of the dielectric layers.

The currently developed structures of capacitors capable of increasing the capacitor region are, for example, a stack structure, a trench structure, a stack-trench structure, a fin structure and a cylinder structure. Although these structures can increase the capacitor region, they require complex additional processing. As a result, they have been used sparingly in increasing the capacitor region of dynamic memory cells.

An example of one of the methods of increasing the capacitor region will now be described in conjunction with the manufacture of a DRAM cell having capacitors of what are known as fin structures.

FIGS. 1a to 1g are schematic sectional views illustrating a method of making a DRAM cell having stacked capacitors of fin structures. As shown in FIG. 1a, field oxide layer 2 is first grown on silicon substrate 1 so that silicon substrate 1 is divided into active regions and field regions. Subsequently, gate oxide layer 3a, polysilicon layer 3 and cap gate oxide layer 3b are formed in turn on the active and field regions. Cap gate oxide layer 3b, polysilicon layer 3 and gate oxide layer 3a are subjected to a photoetching process so as to form polysilicon gate structures (word lines) as shown in FIG. 1a. Silicon substrate 1 is then subjected to a impurity ion injection to form source and drain regions 4, also as shown in FIG. 1a.

As shown in FIG. 1b, $Si_3N_4$ layer 5 ($Si_3N_4$ is known as "nitride") is deposited over the surface of silicon substrate 1. As discussed below, $Si_3N_4$ layer 5 is used as an etch stop layer in a subsequent processing step.

As shown in FIG. 1c, $SiO_2$ layer 6, polysilicon layer 7 for a first fin of the storage node and $SiO_2$ layer 8 are deposited in turn on $Si_3N_4$ layer 5. Thereafter, an opening for a storage node buried contact is formed by a dry etching process.

As shown in FIG. 1d, polysilicon layer 9 is deposited on the overall exposed surface. Polysilicon layer 9 is formed as to contact the remaining portions of polysilicon layer 7 and also region 4 to form a buried contact as shown in FIG. 1d.

As shown in FIG. 1e, storage nodes are then defined by using a mask having a predetermined pattern. That is, polysilicon layers 7 and 9 (for the storage node) and $SiO_2$ layers 6 and 8 are etched by a dry etching process with $Si_3N_4$ layer 5 serving as an etch stop layer.

As shown in FIG. 1f, remaining $SiO_2$ layers 6 and 8 between polysilicon layers 7 and 9 for the storage node and $Si_3N_4$ layer 5 are completely removed by a wet etching process. Subsequently, dielectric layer 10 (denoted by a thick line in FIG. 1g) is formed on the overall exposed surface of the storage node defined by the remaining portions of polysilicon layers 7 and 9 (denoted 9, 7 in FIG. 1g).

As shown in FIG. 1g, polysilicon layer 11 for a plate node is deposited over the overall exposed surface. Polysilicon layer 11 subsequently is defined by mask and etching processes, and $SiO_2$ layer 12 for insulating is deposited on the overall exposed surface. $SiO_2$ layer 12 and $Si_3N_4$ layer 5 are then etched by a dry etching process so as to form bit line contact holes. Thereafter, metal is deposited on the overall exposed surface, and the deposited metal layer is subsequently defined by mask and dry etching processes to form bit line 14. Thus, a DRAM cell having stacked capacitors of fin structures is obtained.

However, such prior art DRAM cells having stacked capacitors of fin structures have the following problems.

First, the process used to produce these structures is complicated due to repeated mask processing steps.

Second, silicon surface 1 at the buried contact regions may be easily damaged because the buried contact regions are formed by a dry etching process. As a result, the junction quality at the buried contact can be deteriorated, and the refresh time for the memory cell increased.

Third, the corner edge angles at the etched portions by the dry etch process are approximately 90°, which can cause irregularities in the thickness of the dielectric layer deposited on and around the etched portions. As a result, the deposited dielectric layer may be easily damaged, thereby resulting in the leakage of current.

SUMMARY OF THE INVENTION

Therefore, it is an object of the present invention to overcome the problems encountered in the prior art and provide a DRAM cell capable of simplifying the manufacturing process and increasing the area of capacitor regions.

In accordance with the present invention, this object is accomplished by providing a method of making a DRAM cell having stacked capacitors of fin structures, comprising the steps of: defining field and active regions on a semiconductor substrate and forming gates (word lines) on the field and active regions; forming side wall oxide layers on sides of the gates (word lines), and forming source and drain regions on the substrate; depositing first, second and third insulation layers on the overall exposed surface in turn; etching the uppermost third insulation layer partially to remove its portions disposed at buried contact regions; wet etching the second insulation layer to remove its exposed portions completely and its hidden portions disposed beneath the third insulation layer partially to a predetermined length for extending the areas of capacitor regions; wet etching the first insulation layer to remove its portions disposed at buried contact regions; depositing a polysilicon layer and then removing its unnecessary portions to form storage nodes; and forming a dielectric layer and plate nodes in turn.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
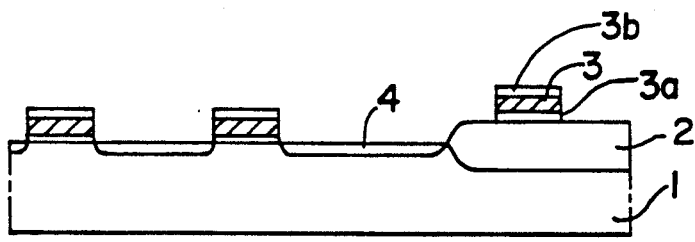
FIGS. 1a to 1g are schematic sectional views illustrating a conventional method of making a DRAM cell having stacked capacitors of fin structures.
Figure 1B:
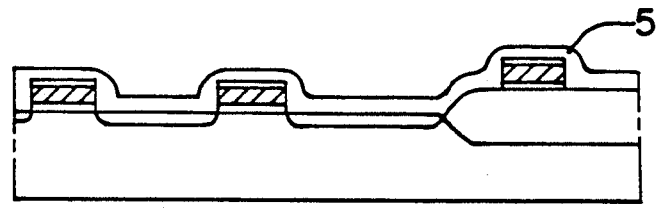
Figure 1C:
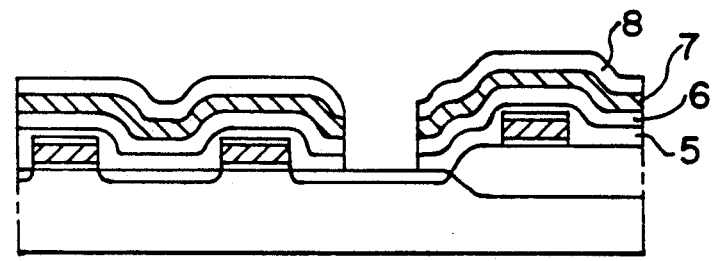
Figure 1D:
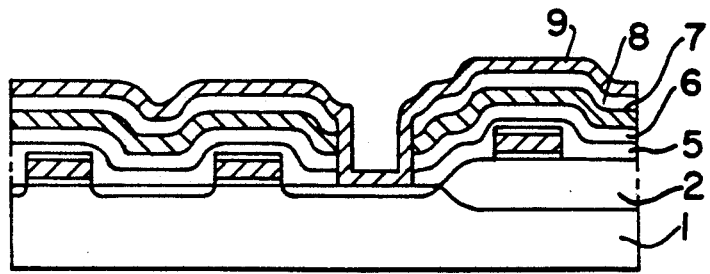
Figure 1E:
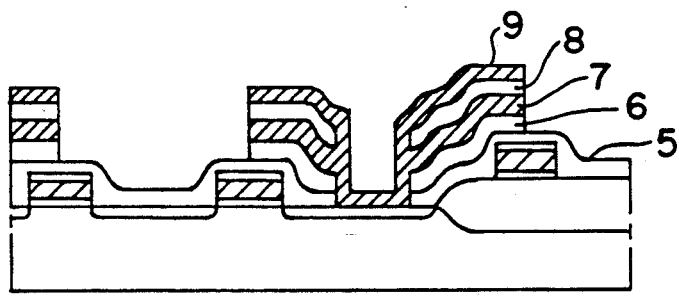
Figure 1F:
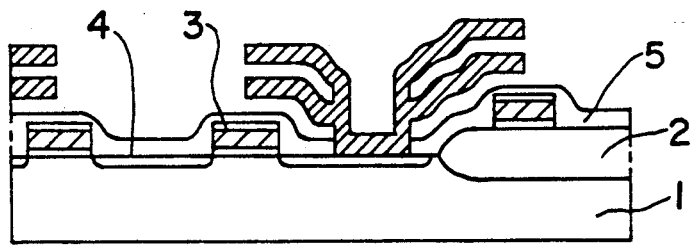
Figure 1G:
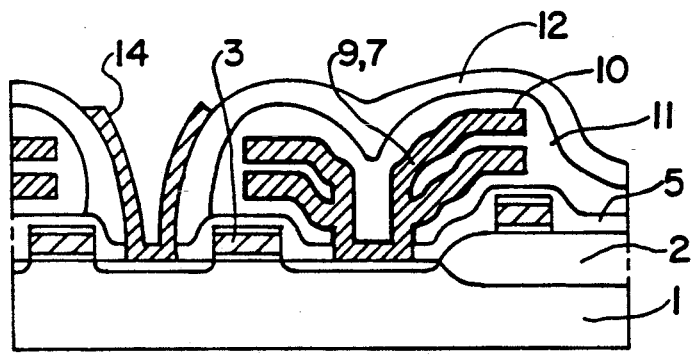
Figure 2A:
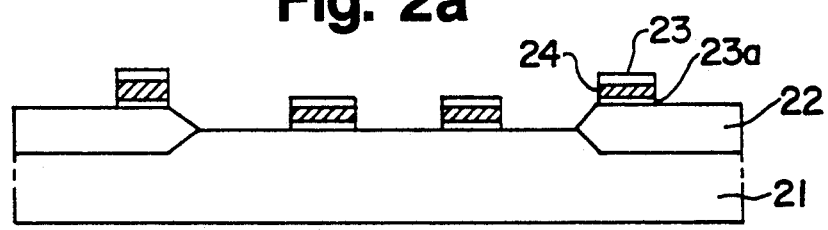
FIGS. 2a to 2h are schematic sectional views illustrating a method of making a DRAM cell having stacked capacitors of fin structures in accordance with the present invention.

As shown in FIG. 2a, field oxide layer 22 is first grown on p-type silicon substrate 21 so that silicon substrate 21 is divided into active regions and field regions, which as shown are formed by what is known as a local oxidation of silicon process. Then, gate oxide layer 23a is grown in the active and field regions, on which is deposited polysilicon layer 24, and on which is formed in turn cap gate oxide layer 23. Cap gate oxide layer 23, polysilicon layer 24 and gate oxide layer 23a are subjected to photoetching processes so as to form gate structures (word lines) as shown in FIG. 2a.

Figure 2B:
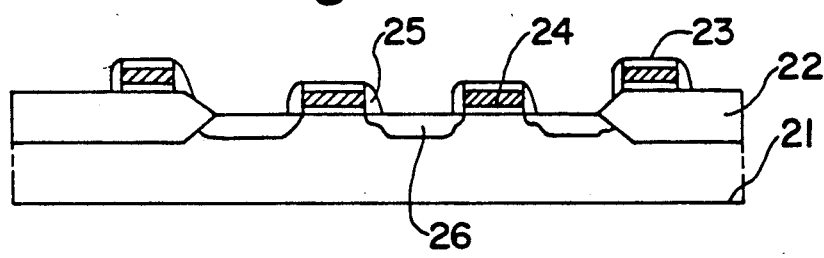

As shown in FIG. 2b, silicon substrate 21 is then subjected to an injection of n-type impurities as a first step to form source and drain regions 26 thereon. On remaining portions of polysilicon layer 24, side wall oxide layer 25 is formed. Thereafter, silicon substrate 21 is subjected to an injection of n+-type impurities to form source and drains 26 having what is known as an LDD or lightly doped drain structure.

Figure 2C:
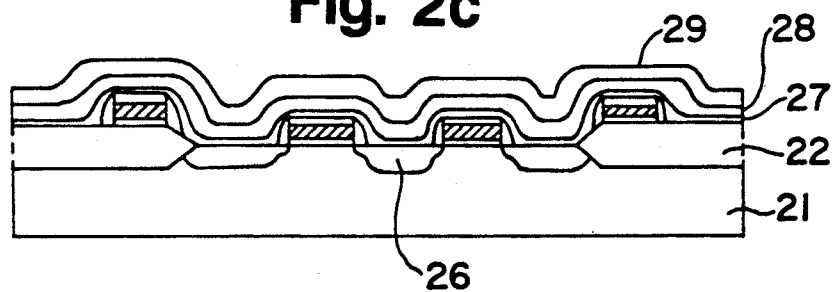

As shown in FIG. 2c, over the overall exposed surface first oxide layer 27 having high etch selectivity, nitride layer 28 and second oxide layer 29 are deposited in turn. First oxide layer 27 is of a sufficient thickness to provide a suitable laminate for nitride layer 28, while second oxide layer 29 is of a suitable thickness thicker than that of first oxide layer 27, and sufficient for use in forming polysilicon storage nodes as more fully described below. On the other hand, nitride layer 28 has a proper thickness so as to provide an increase in the area of the capacitor regions, also as more fully described below.

Figure 2D:
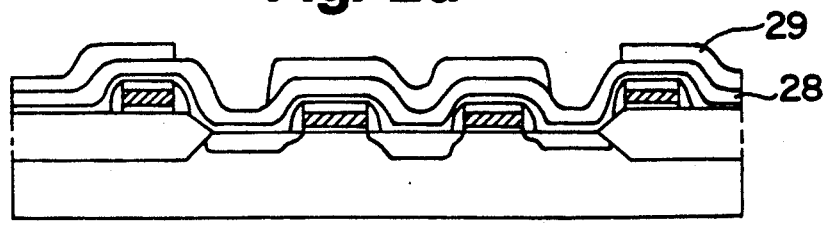
Figure 2E:
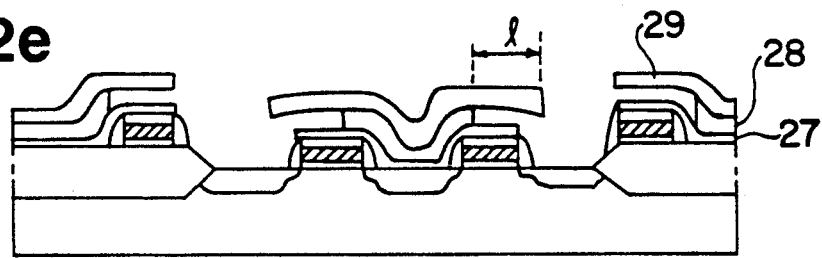

As shown in FIG. 2d, thereafter second oxide layer 29 is defined by a dry etching process so that its portions at buried contact regions are removed to expose partially nitride layer 28. In effect, second oxide layer 29 is defined so as to provide a storage node contact mask. As shown in FIG. 2e, the exposed portions of nitride layer 28 at the buried contact regions are then etched by a wet etching process. The wet etching of nitride layer 28 (to form a storage node contact hole with certain of regions 26) is conducted so as to result in portions of nitride layer 28 disposed beneath second oxide layer 29 also to be etched. The etched length of each hidden portion of nitride layer 28 is a predetermined length 1 as indicated in FIG. 2e, and etched length 1 can be controlled by the time of the wet etch processing.

Figure 2F:
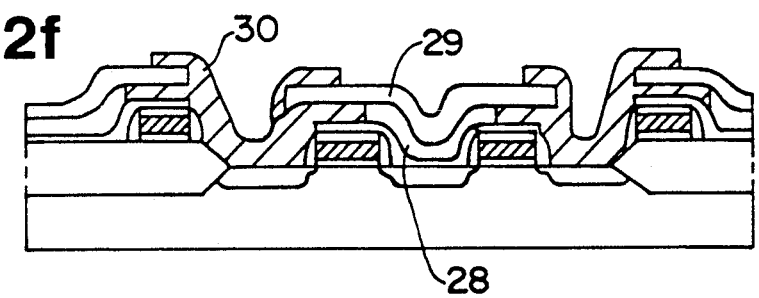
Figure 2G:
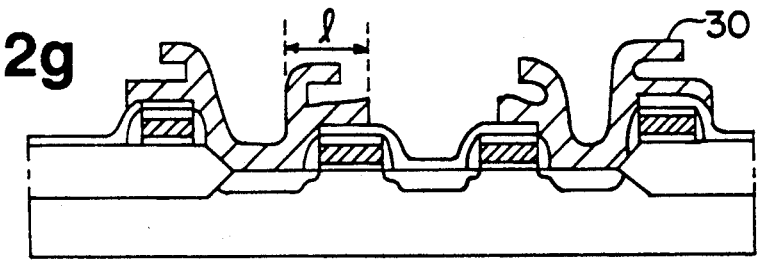

As illustrated in FIG. 2f, portions of oxide layer 27 at the buried contact regions are removed by a wet etching process, and a polysilicon layer is deposited over the overall exposed surface and then removed partially at its unnecessary regions to form polysilicon storage nodes 30. As shown in FIG. 2g, the remaining portions of second oxide layer 29 and nitride layer 28 thereafter are completely removed by wet etching processes.

Figure 2H:
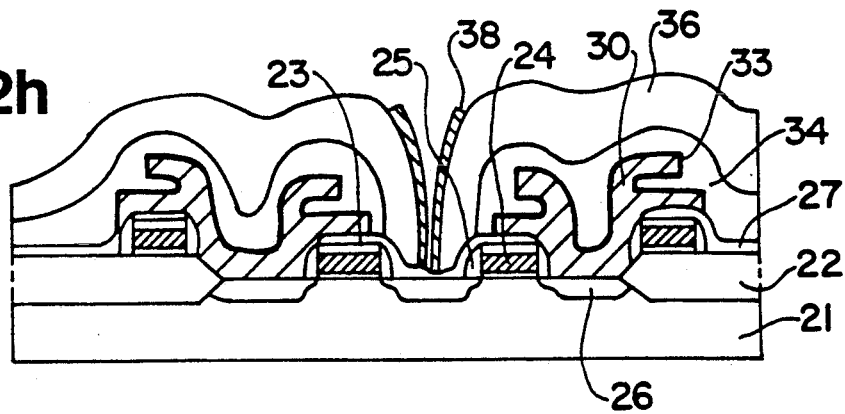

Referring now to FIG. 2h, on the overall exposed surface, dielectric layer 33 (denoted by a thick line in FIG. 2h) and polysilicon layer 34 are formed in turn. Dielectric layer 33 can be oxide, nitride-oxide (NO) or oxide-nitride-oxide (ONO). In the case of NO, such an NO layer can be formed by deposition of a thin nitride layer which is subsequently oxidized, all in a conventional manner. Thereafter, as shown in FIG. 2h, polysilicon layer 34 is removed partially at unnecessary regions to form plate nodes by photo and etching processes in a conventional manner. Subsequently, insulating layer 36 is deposited on the overall exposed surface such as by chemical vapor deposition. Insulating layer 36 is defined by photo and dry etching processes so as to form a bit line contact hole. Thereafter, a metal layer is deposited on the overall exposed surface and defined by photo and dry etching processes to form bit line 38, all in a conventional manner. Thus, an improved DRAM cell having stacked capacitors of fin structures is obtained.

Figure 3A:
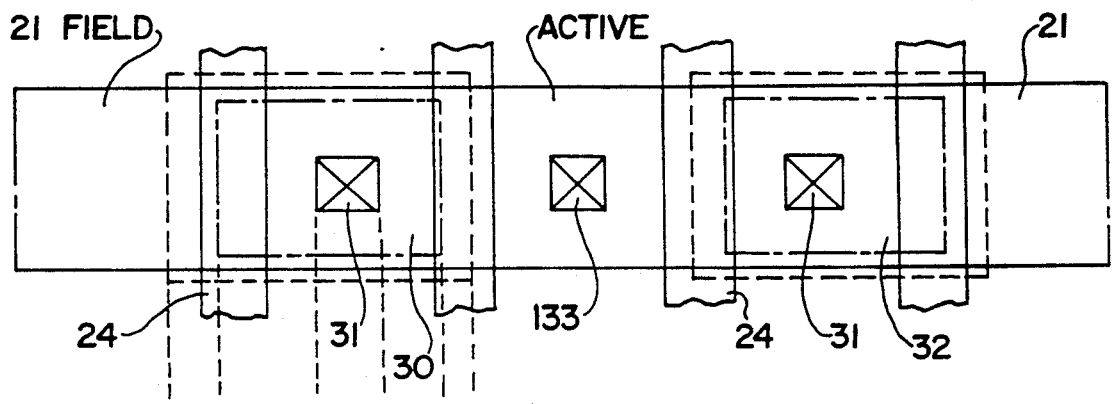
FIGS. 3a and 3b are a schematic plan view and a corresponding sectional view illustrating a DRAM cell having stacked capacitors of fin structures in accordance with the present invention.
Figure 3B:
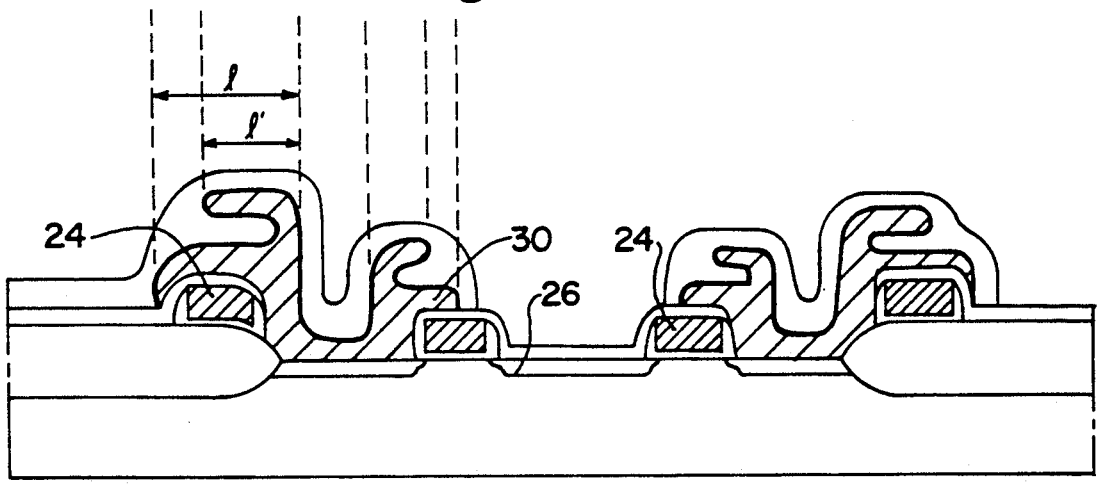

FIGS. 3a and 3b are a schematic plan view and a corresponding sectional view illustrating a DRAM cell having stacked capacitors of fin structures in accordance with the present invention, with the structures illustrated in FIG. 3b generally corresponding to the structures illustrated in FIG. 2h. As shown in FIG. 3a, gate structures (word lines) 24 are disposed under polysilicon storage nodes 30. Bit line contact 33, provides an opening for a bit line metal layer to contact with the centermost source/drain diffusion 26, corresponding to, for example, bit line 38 of FIG. 2h. Dimension 1 generally denotes the dimension of the lower fin of polysilicon storage node 30, and dimension 1' generally denotes the dimension of the upper fin of polysilicon storage node 30.

The method of making DRAM cells having stacked capacitors of fin structures in accordance with the present invention provides the following effects:

First, the present invention utilizes a reduced number of mask processing steps over the prior art, thus simplifying the manufacturing process;

Second, the present invention enables the extension of the capacitor regions, irrespective of the design rules of the manufacturing process, by controlling the wet etch time of nitride layer 28, as is illustrated in FIGS. 3a and 3b;

Third, the present invention enables an increase in the capacitor regions also by controlling the thickness of nitride layer 28, as is illustrated in FIGS. 2e and 2f;

Fourth, the present invention allows for a reduced number of surface defects of silicon substrate 21 at the buried contact regions in that the buried contacts are formed by a wet etching process, thus improving junction quality and refresh characteristics of the memory cell; and Fifth, the present invention provides for improved uniformity of the thickness of the deposited dielectric layer in that the capacitor storage nodes are formed by using a wet etch process, which results in improved step coverage of the dielectric layer because the etched layers have rounded edges, thus avoiding the leakage of current through the dielectric layer and accomplishing an improved yield of acceptable devices on the semiconductor wafer.

Although the preferred embodiments of the present invention have been disclosed, those skilled in the art will appreciate that various modifications are possible without departing from the scope of the present invention as disclosed in the following claims.

What is claimed is:

1. A method of making a DRAM cell having stacked capacitors of fin structures, comprising the steps of:
   (a) defining field regions and active regions on a semiconductor substrate, and forming gates on the field regions and the active regions;
   (b) forming side wall oxide layers on the sides of the gates, and forming source and drain regions on the substrate;
   (c) depositing first, second and third insulation layers in turn on the semiconductor substrate;
   (d) etching the third insulation layer at portions thereof corresponding to buried contact regions of certain of the source and drain regions to form a buried contact hole mask;
   (e) wet etching portions of the second and first insulation layers using the remaining portions of the third insulation layer as a mask, wherein portions of the second insulation layer disposed beneath the third insulation layer are removed to form an open volume beneath portions of the third insulation layer;
   (f) depositing a polysilicon layer, wherein the polysilicon layer is deposited in the open volume beneath portions of the third insulation layer, and removing portions of the polysilicon layer to form storage nodes; and
   (g) forming a dielectric layer and a plate electrode layer.

2. The method as claimed in claim 1, wherein the first and third insulation layers are comprised of a material having a first etch selectivity and the second insulation layer is comprised of a material having a second etch selectivity higher than the first etch selectivity.

3. The method as claimed in claim 2, wherein the first insulation layer comprises oxide, the second insulation layer comprises nitride and the third insulation layer comprises oxide.

4. The method as claimed in claim 1, wherein the polysilicon layer deposited in the open volume beneath portions of the third insulation layer extends the area of the storage nodes, wherein formation of the open volume is controlled by controlling the wet etch time of the second insulation layer.

5. The method as claimed in claim 1, wherein the formation of the open volume is controlled by controlling the thickness of the second insulation layer.

6. The method as claimed in claim 1, wherein the first insulation layer comprises oxide, the second insulation layer comprises nitride and the third insulation layer comprises oxide.

7. The method as claimed in claim 2, wherein the polysilicon layer deposited in the open volume beneath portions of the third insulation layer extends the area of the storage nodes, wherein formation of the open volume is controlled by controlling the wet etch time of the second insulation layer.

8. The method as claimed in claim 2, wherein the formation of the open volume is controlled by controlling the thickness of the second insulation layer.

9. A method of making a DRAM cell having stacked capacitors, comprising the steps of:
   (a) defining field regions and active regions on a semiconductor substrate and forming gates on the field regions and the active regions;
   (b) forming side wall oxide layers on the sides of the gates and forming source and drain regions on the substrate;
   (c) depositing a first silicon dioxide layer on the overall exposed surface;
   (d) depositing a silicon nitride layer on the first silicon dioxide layer, wherein the silicon nitride layer has a thickness greater than the thickness of the first silicon dioxide layer;
   (e) depositing a second silicon dioxide layer on the silicon nitride layer, wherein the second silicon dioxide layer has a thickness greater than the thickness of the first silicon dioxide layer;
   (f) etching the second silicon dioxide layer at portions thereof corresponding to buried contact regions;
   (g) wet etching the silicon nitride layer using the remaining portions of the second silicon dioxide layer as a mask, wherein portions of the silicon nitride layer disposed beneath the second silicon dioxide layer are removed to form an open volume beneath the second silicon dioxide layer;
   (h) etching the first silicon dioxide layer at the buried contact regions;
   (i) depositing a polysilicon layer on the overall exposed surface, wherein polysilicon is deposited in the open volume beneath the second silicon dioxide layer;
   (j) etching the polysilicon layer to form storage nodes of the stacked capacitors;
   (k) etching the second silicon dioxide layer and the silicon nitride layer; and
   (l) forming a dielectric layer and plate nodes of the stacked capacitors.

10. A method for forming a capacitor on a semiconductor substrate comprising the steps of:
    (a) forming a first insulation layer on the semiconductor substrate;
    (b) forming a second insulation layer on the first insulation layer;
    (c) forming a third insulation layer on the second insulation layer;
    (d) etching portions of the third insulation layer;
    (e) wet etching portions of the second insulation layer, wherein portions of the second insulation layer beneath the third insulation layer are removed to form an undercut region;
    (f) etching the first insulation layer to form a contact with the semiconductor substrate;
    (g) forming a polysilicon layer on the overall surface, wherein polysilicon fills at least a portion of the undercut region;
    (h) patterning the polysilicon layer to form an electrode of the capacitor;
    (i) removing remaining portions of the third and second insulation layers;
    (j) forming a dielectric layer on the polysilicon layer; and
    (k) forming a plate electrode on the dielectric layer.

11. The method as claimed in claim 10, wherein the first and third insulation layers are comprised of a material having a first etch selectivity and the second insulation layer is comprised of a material having a second etch selectivity higher than the first etch selectivity.

12. The method as claimed in claim 10, wherein the first insulation layer comprises oxide, the second insulation layer comprises nitride and the third insulation layer comprises oxide.

13. The method as claimed in claim 10, wherein the length of the undercut region is controlled by controlling the wet etch time of the second insulation layer.

14. The method as claimed in claim 10, wherein the length of the undercut region is controlled by controlling the thickness of the second insulation layer.

* * * * *